(12) United States Patent  
Potempa

(10) Patent No.: US 7,148,708 B1
(45) Date of Patent: Dec. 12, 2006

(54) PROBE ASSEMBLY FOR MINIMIZING EXCITATION PICK-UP VOLTAGES

(75) Inventor: Edward M. Potempa, Pittstown, NJ (US)

(73) Assignee: BTech, Inc., Rockaway, NJ (US)

( * ) Notice: Subject to any disclaimer, the term of this patent is extended or adjusted under 35 U.S.C. 154(b) by 0 days.

(21) Appl. No.: 11/386,892

(22) Filed: Mar. 22, 2006

(51) Int. Cl.
*G01R 27/08* (2006.01)
*G01N 27/416* (2006.01)

(52) U.S. Cl. ........................ 324/724; 324/430
(58) Field of Classification Search ............... 324/724, 324/722, 691, 649, 600, 690, 696, 715, 72.5, 324/430
See application file for complete search history.

(56) References Cited

U.S. PATENT DOCUMENTS

| 3,873,911 | A | * | 3/1975 | Champlin | 324/430 |
| 6,172,505 | B1 | * | 1/2001 | Bertness | 324/430 |
| 2004/0095249 | A1 | * | 5/2004 | Zaccaria | 340/636.1 |
| 2005/0057256 | A1 | * | 3/2005 | Bertness | 324/426 |
| 2006/0017447 | A1 | * | 1/2006 | Bertness et al. | 324/538 |

* cited by examiner

*Primary Examiner*—Andrew H. Hirshfeld
*Assistant Examiner*—Hoai-An D. Nguyen
(74) *Attorney, Agent, or Firm*—David L. Davis

(57) ABSTRACT

A probe assembly for use with a battery impedance meter which minimizes excitation pick-up voltages by routing the wires from the meter to the battery cell terminals without forming a loop within a changing magnetic field caused by current drawn from the battery cell.

11 Claims, 6 Drawing Sheets

PROBE ASSEMBLY FOR MINIMIZING EXCITATION PICK-UP VOLTAGES

BACKGROUND OF THE INVENTION

This invention relates to a meter for determining the internal impedance of an individual battery cell within a battery backup system without disconnecting the battery cell from the backup system and, more particularly, to an improved probe assembly for use with the battery impedance meter which minimizes excitation pick-up voltages.

Large battery systems are commonly used to provide backup power in case there is a failure of the commercial power grid. Typically, such a backup system includes a single string, or a plurality of parallel strings, of serially connected rechargeable battery cells and a charger connected to the commercial power grid for maintaining the charge on the battery cells. An inverter is coupled between the strings of battery cells and the load, which inverter is enabled upon the detection of a failure of the commercial power grid. In some applications, the inverter may be continuously operational to power the load with energy from the charger during the time that commercial power is available. Many of these battery backup systems, called "uninterruptible power supplies" (UPS), are configured such that the load is never aware of any failure of the commercial power grid because the battery system immediately supplies the necessary energy upon detecting a failure of the commercial power grid.

A typical installation of such an uninterruptible power supply is between the commercial power grid and a large computer system used by financial, communications, manufacturing and other commercial industries. If the battery system is taken "off-line" for any reason, the necessary protection against a power outage is lost for the time that the battery system is not connected plus the time for recharging, if a significant amount of charge has been removed during the off-line period of time. However, such battery backup systems must be monitored on a regular basis to insure that protection from commercial power grid failure is always available. Therefore, systems have been developed to perform such monitoring while the battery backup system remains on-line.

Impedance measurement is a method by which the condition of a battery cell may be assessed without taking the battery system off-line. Impedance measurements typically impose a current (hereinafter called the "loading current") on the battery cell to be evaluated and measure the resulting voltage. Various commercially available test instruments function this way. Using Kelvin connections, these instruments impose a current on just the battery cell to be measured. After a measurement has been made, the operator moves the Kelvin clips to the next battery cell, reads the value, moves the clips to the next cell, and continues in this manner until all the battery cells have been measured. Therefore, the loading current flows almost entirely through the battery cell being measured, it being thought that the parallel paths (if they exist) are generally of so much higher impedance that any loading current flowing through them is of little or no consequence. However, FIG. 1 illustrates how conventional prior art measurement apparatus results in unavoidable errors.

FIG. 1 illustrates a typical two probe battery impedance meter 10 with a Kelvin connection to the battery cell 12, meaning that there are separate contacts to the battery for current drawn and voltage sensed. The meter 10 draws current (i) from the battery cell 12, symbolized by the current source 14. The drawn current is at a predetermined amplitude and frequency. While drawing the current, the meter 10 measures the voltage drop across the battery cell 12. The voltage measuring circuit in the meter is symbolized by the voltmeter 16. The ratio of voltage drop to current drawn is the internal impedance of the battery cell 12. Where the cables 18, 20 physically separate to the probes 22, 24 at the battery posts 26, 28, a one-turn coil is formed. The current passing through the wires going to the current source 14 produces a magnetic field in the formed coil. The magnetic field is made up of flux lines symbolized in FIG. 1 as circles with either a dot or a cross inside. The crosses signify that the flux lines are going into the page and the dots signify that the flux lines are coming out of the page. This magnetic field induces an excitation pick-up voltage in the wires, symbolized by $v_i$. Faraday's law states that if a coil of N turns is placed in a region of changing flux ($\phi$), a voltage ($v_i$) will be induced across the coil according to equation (1):

$$v_i = N(d\phi/dt). \qquad (1)$$

The meter 10 will therefore measure a voltage (v) according to equation (2):

$$v = v_i + v_b, \qquad (2)$$

where $v_b$ is the actual voltage across the battery cell 12.

The term $v_i$ thus causes an error in measuring the battery impedance because battery impedance should only use the voltage drop across the battery ($v_b$). It is difficult to compensate for $v_i$ because $v_i$ will change for different loop geometries. Since the spacing of the terminals 26, 28 differs from battery to battery, the loop geometries are different, and therefore $v_i$ is different and unpredictable.

It would therefore be desirable to be able to minimize the excitation pick-up voltage while taking battery cell impedance measurements.

SUMMARY OF THE INVENTION

According to the present invention, a probe assembly for use with a battery impedance meter, which includes a voltage sensing device having two terminals and a current source having two terminals, comprises a first probe adapted for connection to a selected one of the positive and negative terminals of a battery cell, a second probe adapted for connection to the other one of the positive and negative terminals of the battery cell, and a cable assembly. The cable assembly includes four wires each adapted for connection at a first end to a respective one of the terminals of the current source and the voltage sensing device. At least three of the wires are constrained to extend in close proximity to each other from the battery impedance meter to the first probe. One of the at least three wires which is connected to the current source and one of the at least three wires which is connected to the voltage sensing device are each connected at their second ends to the first probe. At most one wire which is not constrained with the at least three wires is connected at its second end to the second probe. At least one bypass wire has a first end connected to the second probe and a second end insulatively held to the first probe and connected to the second end of one of the at least three constrained wires which is not connected to the first probe.

BRIEF DESCRIPTION OF THE DRAWINGS

The foregoing will be more readily apparent from reading the following description in conjunction with the drawings in which like elements in different figures thereof are identified by the same reference numeral and wherein.

DETAILED DESCRIPTION

Figure 1:
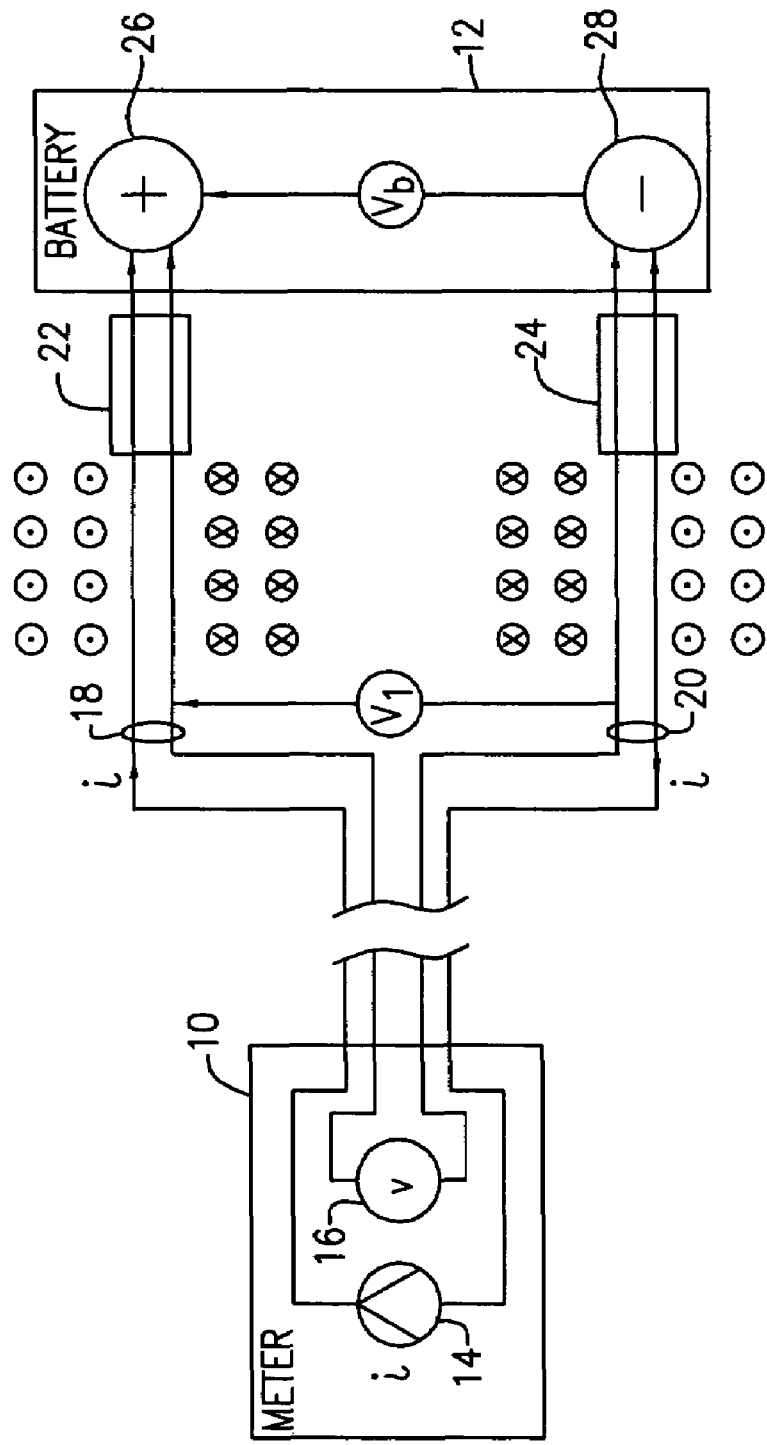
FIG. 1 is a simplified schematic circuit diagram illustrating a prior art arrangement for connecting a battery impedance meter to the positive and negative terminals of a battery cell.
Figure 2:
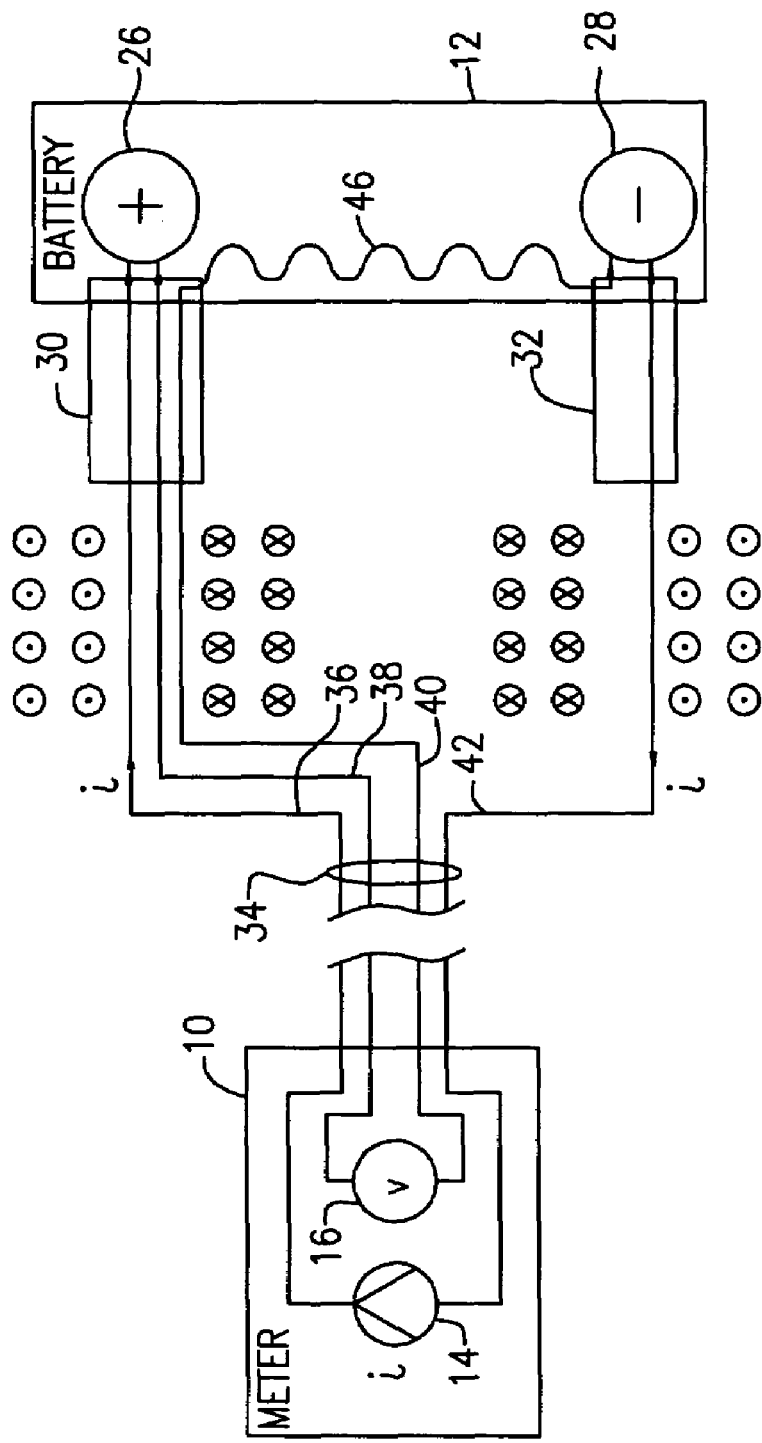
FIG. 2 is a simplified schematic circuit diagram similar to FIG. 1 illustrating a first embodiment of the improved probe assembly according to the present invention.
Figure 3:
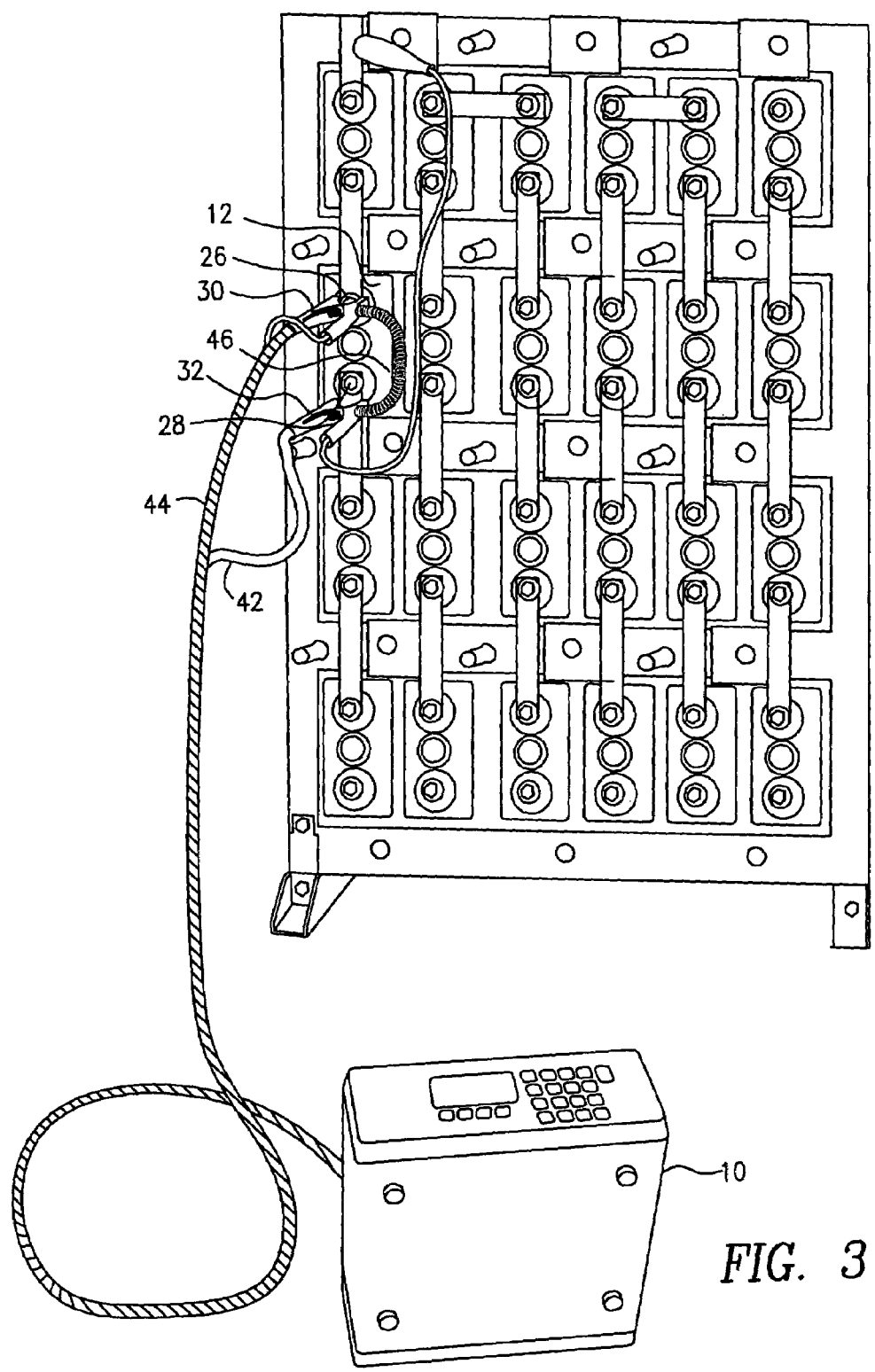
FIG. 3 illustrates the connection of a battery impedance meter to a selected battery cell of a battery backup system, utilizing equipment according to the first embodiment of the present invention.
Figure 4:
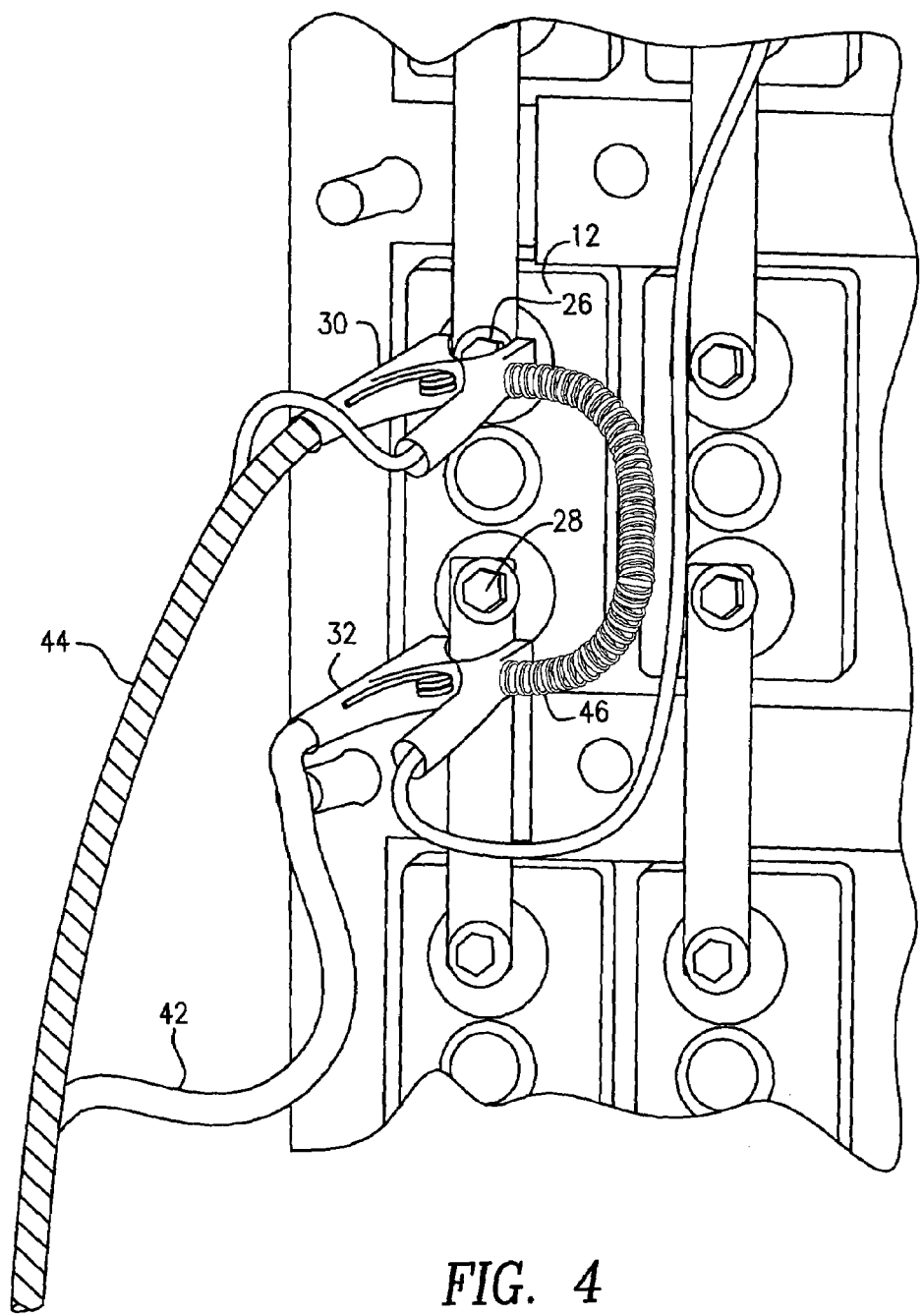
FIG. 4 is an enlarged view of a portion of FIG. 3 showing the connections of the inventive probe assembly to the terminals of the selected battery cell.

Referring to FIGS. 2–4, the inventive probe assembly avoids the pickup of excitation voltages in the wires connected to the voltage sensing device 16 by eliminating the loop from those wires, in contrast to the prior art arrangement illustrated in FIG. 1 and discussed above. As schematically shown in FIG. 2, a first embodiment of the inventive probe assembly includes the probes 30 and 32 and the cable assembly 34 extending from the battery impedance meter 10 to the probes 30, 32. The probes 30, 32 are adapted for connection to respective terminals of the battery cell 12. As shown in FIGS. 3 and 4, the probes 30, 32 are illustratively large, spring-loaded, alligator clips which clamp onto the battery cell terminals 26, 28 or the shunt bars extending between adjacent battery cells. It is understood that the present invention contemplates that other types of probes can be utilized to practice the invention.

The cable assembly 34 includes four wires 36, 38, 40 and 42. The wire 36 is connected at a first end to a first terminal of the current source 14 and is connected at its other end to the probe 30. The wire 38 is connected at a first end to a first terminal of the voltmeter 16 and is connected at its other end to the probe 30. The wire 40 is connected at a first end to a second terminal of the voltmeter 16 and is attached at its other end to the probe 30 while being electrically insulated therefrom. The wire 42 is connected at a first end to a second terminal of the current source 14 and is connected at its other end to the probe 32. The wires 36, 38 and 40 are constrained to extend in close proximity to each other from the meter 10 to the probe 30, illustratively by being enclosed within a sheath 44 (FIG. 3). The wire 42 exits the sheath 44 before reaching the probe 30 so that the probes 30 and 32 can be separated to reach different battery terminals.

Lastly, to complete the connection of the voltmeter 16 across the terminals 26, 28 of the battery cell 12, there is provided a bypass wire 46 which is connected at a first end to the wire 40 at the probe 30, while being electrically insulated from the probe 30, and is connected at its other end to the probe 32. Preferably, the bypass wire 46 is in the form of a wire coil, which is elastic so that it extends and contracts to accommodate the spacing between the battery cell terminals 26, 28.

Since the wires 38 and 40, which are connected across the voltmeter 16, are within the sheath 44, there is no loop formed by those wires which can pick up induced voltage from the current traveling through the wires 36 and 42. There is still a magnetic field caused by the current flow in the wires 36 and 42, but the voltage sense wires 38 and 40 are routed so as not to make a loop within that magnetic field. To summarize, the two voltage sense wires 38 and 40 are brought together to the probe 30. When the wires 38 and 40 are close together, no loop exists and a voltage cannot be induced from the magnetic field. At the probe 30 the wires 38 and 40 are split up, with the wire 38 going to the battery terminal 26 and the wire 40 being connected to the bypass wire 46. The magnetic field is bypassed, and therefore the voltmeter 16 will measure only $v_b$. The wire coil 46 will extend and contract so as not to fall in the magnetic field.

Figure 5:
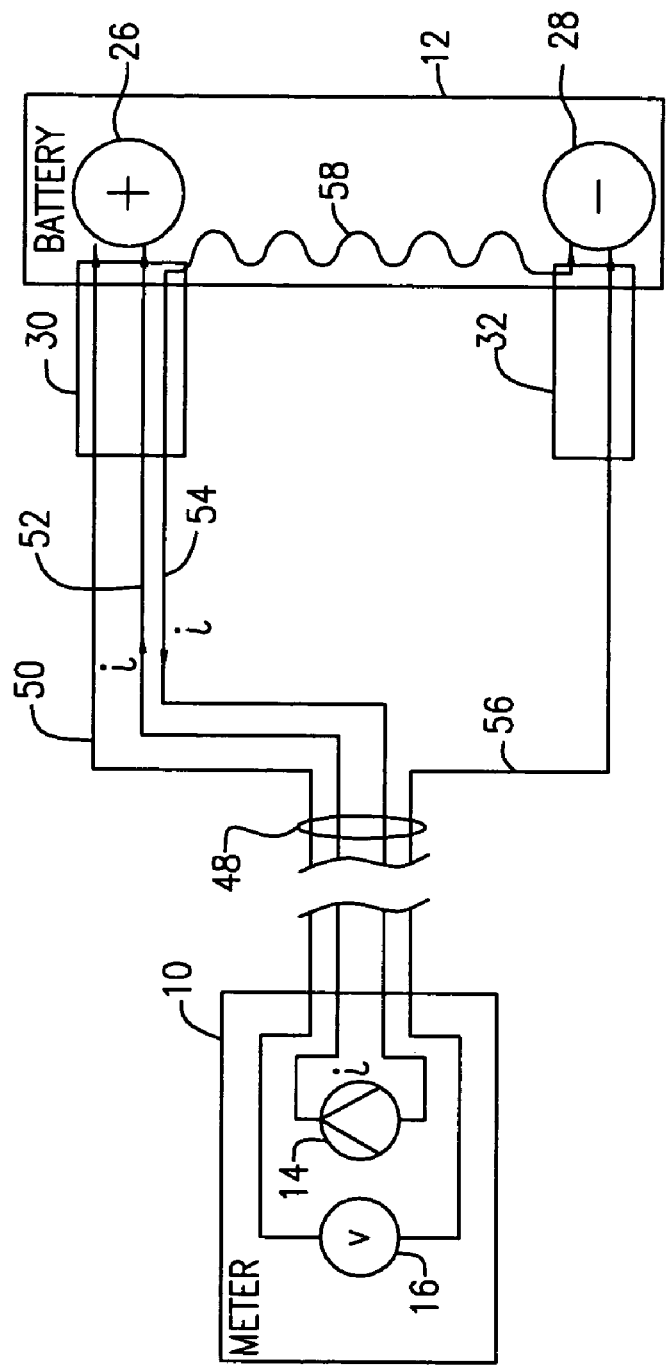
FIG. 5 is a simplified schematic circuit diagram similar to FIG. 1 illustrating a second embodiment of the improved probe assembly according to the present invention.

A second embodiment of the present invention is shown in FIG. 5. That embodiment differs from the embodiment shown in FIG. 2 by having the two wires connected to the current source 14 run together so that the induced magnetic field is cancelled out, as is the case where twisted pairs of wires are used. Thus, the cable assembly 48 includes four wires 50, 52, 54 and 56. The wire 50 is connected at a first end to a first terminal of the voltmeter 16 and is connected at its other end to the probe 30. The wire 52 is connected at a first end to a first terminal of the current source 14 and is connected at its other end to the probe 30. The wire 54 is connected at a first end to a second terminal of the current source 14 and is attached at its other end to the probe 30 while being electrically insulated therefrom. The wire 56 is connected at a first end to a second terminal of the voltmeter 16 and is connected at its other end to the probe 32. The wires 50, 52 and 54 are constrained to extend in close proximity to each other from the meter 10 to the probe 30, illustratively by being enclosed within the sheath 44 (FIG. 3). The wire 56 exits the sheath 44 before reaching the probe 30 so that the probes 30 and 32 can be separated to reach different battery terminals.

Lastly, to complete the connection of the current source 14 across the terminals 26, 28 of the battery cell 12, there is provided a bypass wire 58 which is connected at a first end to the wire 54 at the probe 30, while being electrically insulated from the probe 30, and is connected at its other end to the probe 32. Preferably, the bypass wire 58 is in the form of a wire coil, which is elastic so that it extends and contracts to accommodate the spacing between the battery cell terminals 26, 28.

Since the wires 52 and 54, which are connected across the current source 14, are within the sheath 44, there is no magnetic field caused by the current flow in the wires 52 and 54. Therefore there is no induced voltage in the wires 50 and 56 and the voltmeter 16 will measure only $v_b$.

Figure 6:
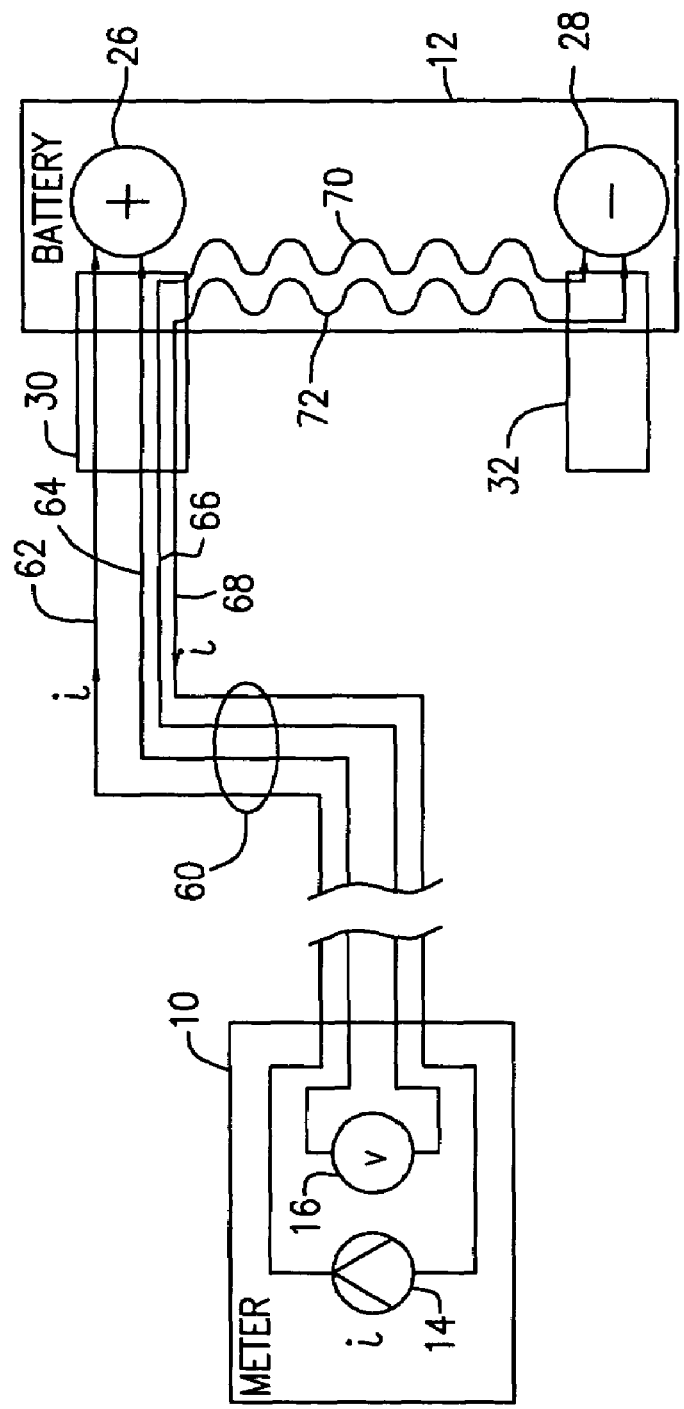
FIG. 6 is a simplified schematic circuit diagram similar to FIG. 1 illustrating a third embodiment of the improved probe assembly according to the present invention.

A third embodiment of the present invention is shown in FIG. 6. That embodiment differs from the embodiment shown in FIG. 2 by having the four wires connected to the meter 10 run together so that the induced magnetic field is cancelled out, as is the case where twisted pairs of wires are used, and also not having any loop of the wires connected to the voltmeter 16 which could pick up a voltage induced from a magnetic field. Thus, the cable assembly 60 includes four wires 62, 64, 66 and 68. The wire 62 is connected at a first end to a first terminal of the current source 14 and is connected at its other end to the probe 30. The wire 64 is connected at a first end to a first terminal of the voltmeter 16 and is connected at its other end to the probe 32. The wire 66 is connected at a first end to a second terminal of the voltmeter 16 and is attached at its other end to the probe 30 while being electrically insulated therefrom. The wire 68 is connected at a first end to a second terminal of the current source 14 and is attached at its other end to the probe 30 while being electrically insulated therefrom. The wires 62, 64, 66 and 68 are constrained to extend in close proximity to each other from the meter 10 to the probe 30, illustratively by being enclosed within the sheath 44 (FIG. 3).

Lastly, to complete the connection of the current source 14 and the voltmeter 16 across the terminals 26, 28 of the battery cell 12, there are provided bypass wires 70 and 72 which are connected at a first end to the wires 66 and 68, respectively, at the probe 30, while being electrically insulated from the probe 30, and are connected at their other ends to the probe 32. Preferably, the bypass wires 70 and 72 are in the form of wire coils, which are elastic so that they extend and contract to accommodate the spacing between the battery cell terminals 26, 28. Alternatively, it is only necessary to provide a single bypass wire to replace the pair of bypass wires 70 and 72, since the bypass wires 70 and 72 are connected together at the probe 32.

Since the wires 62 and 68, which are connected across the current source 14, are within the sheath 44, there is no magnetic field caused by the current flow in the wires 62 and 68. Therefore there is no induced voltage in the wires 64 and 66 and the voltmeter 16 will measure only $v_b$.

Accordingly, there has been disclosed an improved probe assembly for minimizing excitation pick-up voltages. While illustrative embodiments of the present invention have been disclosed herein, it will be appreciated by those of skill in the art that various adaptations and modifications to the disclosed embodiments are possible, and it is therefore intended that this invention be limited only by the scope of the appended claims.

What is claimed is:

1. A probe assembly for use with a battery impedance meter which includes a voltage sensing device having two terminals and a current source having two terminals, the probe assembly comprising:
    a first probe adapted for connection to a selected one of the positive and negative terminals of a battery cell;
    a second probe adapted for connection to the other one of the positive and negative terminals of said battery cell;
    a cable assembly including four wires each adapted for connection at a first end to a respective one of the terminals of the current source and the voltage sensing device, wherein at least three of the wires are constrained to extend in close proximity to each other from the battery impedance meter to the first probe, wherein one of the at least three wires which is connected to the current source and one of the at least three wires which is connected to the voltage sensing device are each connected at their second ends to the first probe, wherein at most one wire which is not constrained with the at least three wires is connected at its second end to the second probe; and
    at least one bypass wire having a first end connected to the second probe and a second end insulatively held to the first probe and connected to the second end of one of the at least three constrained wires which is not connected to the first probe.

2. The probe assembly according to claim 1 wherein the at least one bypass wire comprises a wire coil.

3. The probe assembly according to claim 1 wherein all four wires of the cable assembly are constrained.

4. The probe assembly according to claim 1 wherein there are exactly three wires of the cable assembly which are constrained and the one wire which is not constrained is connected to the current source.

5. The probe assembly according to claim 1 wherein there are exactly three wires of the cable assembly which are constrained and the one wire which is not constrained is connected to the voltage sensing device.

6. A probe assembly for use with a battery impedance meter which includes a voltage sensing device and a current source, the probe assembly comprising:
    a first probe adapted for connection to a selected one of the positive and negative terminals of a battery cell;
    a second probe adapted for connection to the other one of the positive and negative terminals of said battery cell;
    a cable assembly extending from the meter to the first and second probes, the cable assembly including:
        a first wire connected at a first end to a first terminal of the current source and connected at a second end to the first probe;
        a second wire connected at a first end to a first terminal of the voltage sensing device and connected at a second end to the first probe;
        a third wire connected at a first end to a second terminal of the voltage sensing device and attached at a second end to the first probe while being electrically insulated therefrom; and
        a fourth wire connected at a first end to a second terminal of the current source and connected at a second end to the second probe;
        wherein the first, second and third wires of said cable assembly are constrained to extend in close proximity to each other from the battery impedance meter to the first probe; and
    a bypass wire connected at a first end to the third wire at the first probe and connected at a second end to the second probe.

7. The probe assembly according to claim 6 wherein the bypass wire comprises a wire coil.

8. A probe assembly for use with a battery impedance meter which includes a voltage sensing device and a current source, the probe assembly comprising:
    a first probe adapted for connection to a selected one of the positive and negative terminals of a battery cell;
    a second probe adapted for connection to the other one of the positive and negative terminals of said battery cell;
    a cable assembly extending from the meter to the first and second probes, the cable assembly including:
        a first wire connected at a first end to a first terminal of the current source and connected at a second end to the first probe;
        a second wire connected at a first end to a first terminal of the voltage sensing device and connected at a second end to the first probe;
        a third wire connected at a first end to a second terminal of the current source and attached at a second end to the first probe while being electrically insulated therefrom; and
        a fourth wire connected at a first end to a second terminal of the voltage sensing device and connected at a second end to the second probe;
        wherein the first, second and third wires of said cable assembly are constrained to extend in close proximity to each other from the battery impedance meter to the first probe; and
    a bypass wire connected at a first end to the third wire at the first probe and connected at a second end to the second probe.

9. The probe assembly according to claim 8 wherein the bypass wire comprises a wire coil.

10. A probe assembly for use with a battery impedance meter which includes a voltage sensing device and a current source, the probe assembly comprising:
- a first probe adapted for connection to a selected one of the positive and negative terminals of a battery cell;
- a second probe adapted for connection to the other one of the positive and negative terminals of said battery cell;
- a cable assembly extending from the meter to the first and second probes, the cable assembly including:
  - a first wire connected at a first end to a first terminal of the current source and connected at a second end to the first probe;
  - a second wire connected at a first end to a first terminal of the voltage sensing device and connected at a second end to the first probe;
  - a third wire connected at a first end to a second terminal of the current source and attached at a second end to the first probe while being electrically insulated therefrom; and
  - a fourth wire connected at a first end to a second terminal of the voltage sensing device and attached at a second end to the first probe while being electrically insulated therefrom;
  - wherein the first, second, third and fourth wires of said cable assembly are constrained to extend in close proximity to each other from the battery impedance meter to the first probe; and
- at least one bypass wire connected at a first end to the third and fourth wires at the first probe and connected at a second end to the second probe.

11. The probe assembly according to claim 10 wherein the at least one bypass wire comprises a wire coil.

* * * * *